United States Patent
Ross et al.

(10) Patent No.: US 10,979,051 B1
(45) Date of Patent: Apr. 13, 2021

(54) LEVEL SHIFTER WITH STATE REINFORCEMENT CIRCUIT

(71) Applicant: Allegro MicroSystems, LLC, Manchester, NH (US)

(72) Inventors: Thomas Ross, Livingston (GB); James McIntosh, Longniddry (GB)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/907,511

(22) Filed: Jun. 22, 2020

(51) Int. Cl.
*H03K 19/0185* (2006.01)
*H03K 19/20* (2006.01)

(52) U.S. Cl.
CPC ..... *H03K 19/018521* (2013.01); *H03K 19/20* (2013.01)

(58) Field of Classification Search
USPC .......................................................... 326/81
See application file for complete search history.

(56) References Cited

U.S. PATENT DOCUMENTS

| | | | |
|---|---|---|---|
| 4,695,744 A * | 9/1987 | Giordano | ......... H03K 3/356104 327/210 |
| 5,917,359 A | 6/1999 | Fukunaga et al. | |
| 6,002,290 A * | 12/1999 | Avery | .............. H03K 3/356113 326/62 |
| 6,559,689 B1 | 5/2003 | Clark | |
| 7,646,616 B2 | 1/2010 | Wekhande et al. | |
| 7,787,262 B2 | 8/2010 | Mangtani et al. | |
| 7,994,821 B1 * | 8/2011 | Wang | ............... H03K 3/356069 326/81 |
| 8,610,462 B1 * | 12/2013 | Wang | ............... H03K 3/356113 326/68 |
| 8,633,745 B1 | 1/2014 | Peterson | |
| 9,203,339 B2 | 12/2015 | Sato | |
| 9,214,884 B2 | 12/2015 | Sonoda et al. | |
| 9,929,683 B2 | 3/2018 | Sonoda et al. | |
| 10,230,356 B2 | 3/2019 | Snowdon | |
| 2020/0021212 A1 | 1/2020 | Yamada et al. | |
| 2020/0028456 A1 | 1/2020 | Morioka et al. | |

* cited by examiner

*Primary Examiner* — Anh Q Tran
(74) *Attorney, Agent, or Firm* — Daly, Crowley, Mofford & Durkee, LLP

(57) ABSTRACT

In one aspect, an integrated circuit (IC) includes a level shifter configured to generate a first output signal and a second output signal, and to receive an input voltage, a first supply voltage and a second supply voltage; and a state reinforcement circuit configured to maintain a logical state of the second output signal in response to the first supply voltage having a voltage below ground and the input voltage is logical high. If the input voltage is logical high, then the first output signal is logical low and the second output signal is logical high; and, if the input voltage is logical low, the first output signal is logical high and the second output signal is logical low.

23 Claims, 3 Drawing Sheets

LEVEL SHIFTER WITH STATE REINFORCEMENT CIRCUIT

BACKGROUND

In general, a level shifter shifts a voltage from one voltage level to another voltage level. For example, a low-to-high voltage level shifter shifts from a low voltage level a higher voltage level.

SUMMARY

In one aspect, an integrated circuit (IC) includes a level shifter configured to generate a first output signal and a second output signal, and to receive an input voltage, a first supply voltage and a second supply voltage; and a state reinforcement circuit configured to maintain a logical state of the second output signal in response to the first supply voltage having a voltage below ground and the input voltage is logical high. If the input voltage is logical high, then the first output signal is logical low and the second output signal is logical high; and, if the input voltage is logical low, the first output signal is logical high and the second output signal is logical low.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to stabilize the state of output signals for a low-to-high voltage level shifter. In one particular example, a level shifter with a state reinforcement circuit prevents an output signal from the level shifter, for example, to inadvertently turn "on" or turn "off" a gate of a transistor that may be connected to the output of level shifter.

Figure 1:
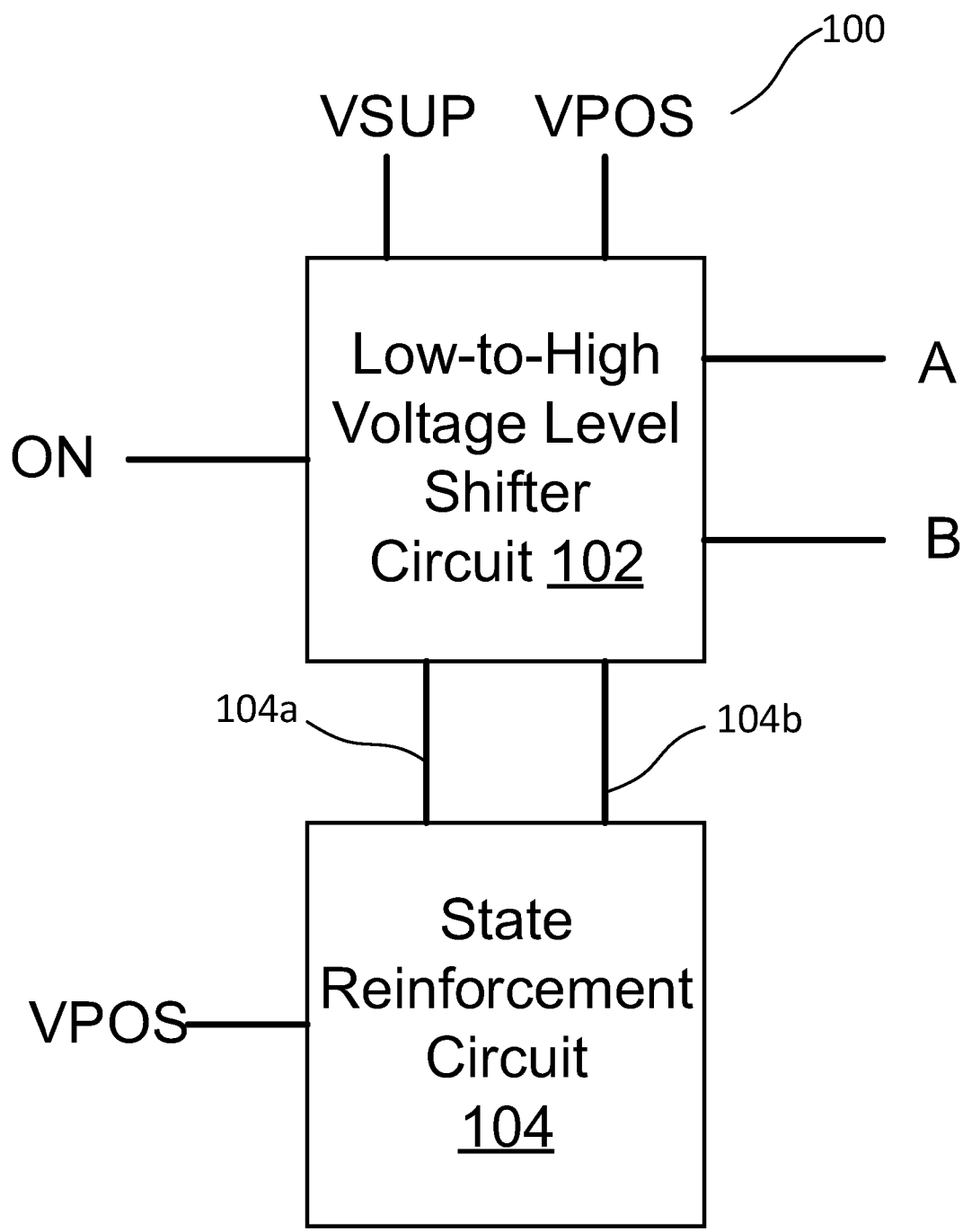
FIG. 1 is a block diagram of an example of a low-to-high voltage level shifter circuit and a state reinforcement circuit configuration.

Referring to FIG. 1, a system 100 includes a low-to-high voltage level shifter circuit 102 and a state reinforcement circuit 104. The level shifter circuit 102 receives an input signal ON and produces output signals A, B. In one example, the voltage of the ON signal is relatively low compared to the signals A, B, which are relatively higher. In one particular example, if the input signal ON is logical high, the voltage may be about 5 volts while the output signal A is logical high, but at about 100 volts, for example. Thus, the level shifter circuit 102 shifts from the low voltage input signal ON to a high voltage output signal A. The level shifter circuit 102 receives a first supply voltage VSUP and a second supply voltage VPOS.

The state reinforcement circuit 104 provides two signals paths 104a, 104b to the level shifter circuit 102. The state reinforcement circuit 104 receives the second supply voltage VPOS.

Without the state reinforcement circuit 104, if the first supply voltage VSUP should fall below ground, an undesirable voltage change may occur to at least one of the output signals A, B and thereby causing a change in logical state. For example, the outputs signals A, B may be negative voltage. In another particular example, the output signal A is logical low and the output signal B is logical high, but when the first supply voltage VSUP falls below ground and returns above ground, the outputs signals A, B may switch logical states so that output signal A becomes logical high and the output signal B becomes logical low. However, with the state reinforcement circuit 104, the signal paths 104a, 104b are used to reinforce the output logical state of the output signals A, B so that the outputs signals A, B do not change their respective logical state when the first supply voltage VSUP falls below ground and returns above ground.

Figure 2:
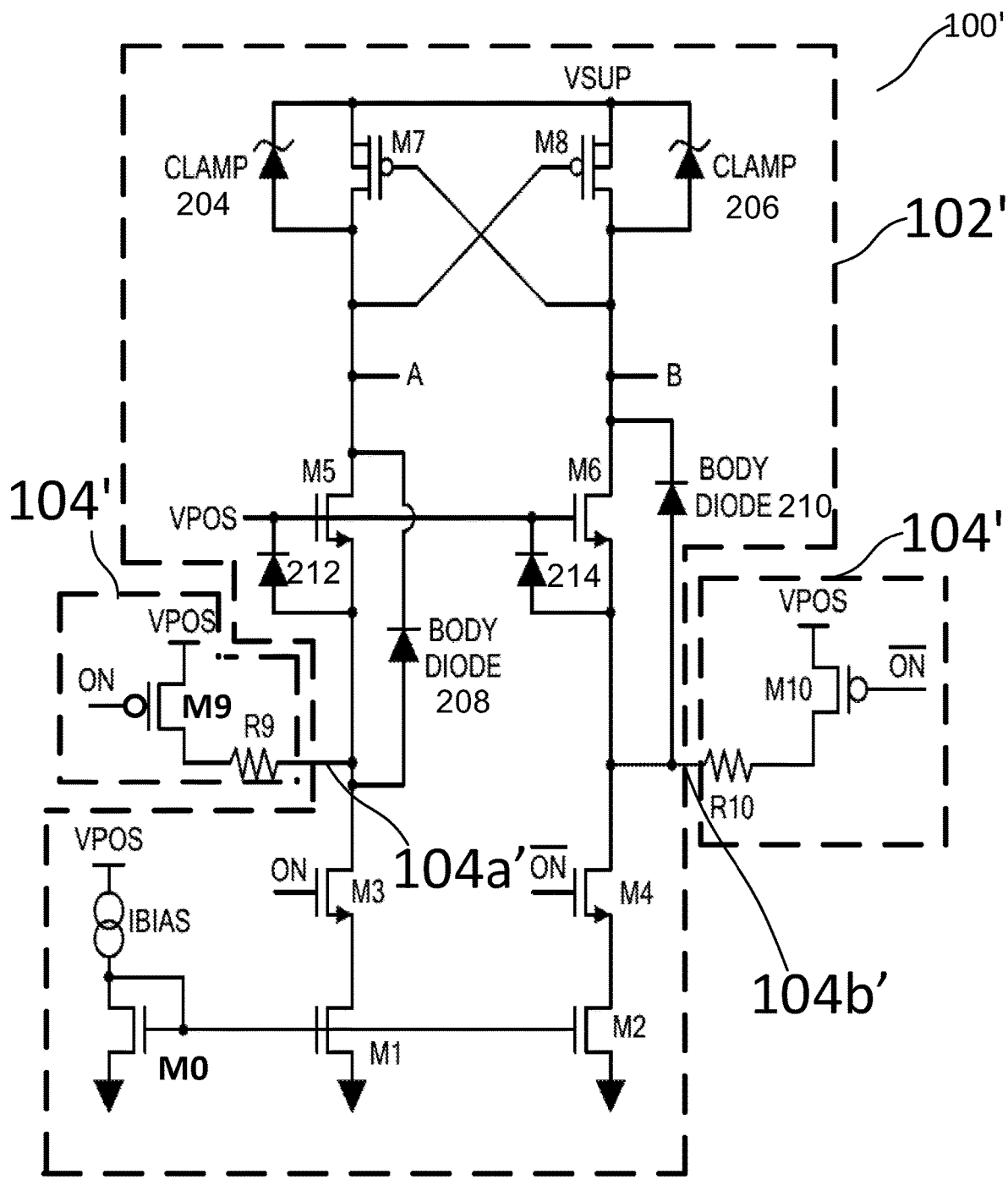
FIG. 2 is a circuit diagram of an example of the low-to-high voltage level shifter circuit and the state reinforcement circuit.

Referring to FIG. 2, an example of the system 100 is a circuit 100'. The circuit 100' includes a level shifter circuit 102' and a state reinforcement circuit 104'.

The level shifter circuit 102' is an example of the level shifter circuit 102 (FIG. 1). The level shifter circuit 102' includes a transistor M0, a transistor M1, a transistor M2, a transistor M3, a transistor M4, a transistor M5, a transistor M6, a transistor M7 and a transistor M8. In one example, the transistors M1-M6 are n-channel metal-oxide-semiconductor field-effect transistors (NMOS). In one example, the transistors M7, M8 are p-channel metal-oxide-semiconductor field-effect transistors (PMOS).

The gates of the transistors M0-M2 are connected to each other and connected to a current source IBIAS that is connected to the second supply voltage VPOS. Sources of the transistors M0-M2 are connected to ground. A drain of transistor M0 is connected to its gate and the current source IBIAS.

A drain of the transistor M1 is connected to a source of the transistor M3. A gate of the transistor M3 is connected to the input signal ON. A drain of the transistor M3 is connected to a source of the transistor M5.

A drain of the transistor M5 is connected to a gate of the transistor M8, the drain of the transistor M7, and to a node that provides the output signal A. A body diode 208 formed by the transistor M5 connects the source and drain of the transistor M5. A diode 212 connects the source of the transistor M5 to a gate of the transistor M5. The gate of the transistor M5 receives the second supply voltage VSUP.

A drain of the transistor M2 is connected to a source of the transistor M4. A gate of the transistor M4 is connected to an inverse of the input signal $\overline{ON}$. A drain of the transistor M4 is connected to a source of the transistor M6.

A drain of the transistor M6 is connected to a gate of the transistor M7, the drain of the transistor M8, and to a node that provides the output signal B. A body diode 210 formed by the transistor M6 connects the source and drain of the transistor M6. A diode 214 connects the source of the transistor M6 to a gate of the transistor M6. The gate of the transistor M6 receives the second supply voltage VSUP.

A source of the transistor M7 and a source of the transistor M8 are each connected to the first supply voltage VSUP. A clamp 204 connects the drain of the transistor M7 to the source of the transistor M7. A clamp 206 connects the drain of the transistor M8 to the source of the transistor M8.

The state reinforcement circuit 104' is an example of the state reinforcement circuit 104 (FIG. 1). The state reinforcement circuit 104' includes a transistor M9 with a gate connected to the input signal ON, a source connected to the second supply voltage VPOS and a drain connected to one end of a resistor R9. The other end of the resistor R9 is connected to the source of the transistor M5 and the drain of the transistor M3 and provides the signal path 104a', which is an example of the single path 104a (FIG. 1).

The state reinforcement circuit 104' also includes a transistor M10 with a gate connected to an inverse of the input signal $\overline{\text{ON}}$, a source connected to the second supply voltage VPOS and a drain connected to one end of a resistor R10. The other end of the resistor R10 is connected to the source of the transistor M6 and the drain of the transistor M4 and provides the signal path 104b', which is an example of the single path 104b (FIG. 1).

In one mode, the input signal ON is logical high. With the input signal ON logical high, the transistor M3 is turned "on" and draws current to ground so that the output signal A is logical low and the gate of transistor M8 is turned "on." With the transistor M8 turned "on" the drain of the transistor M8 is pulled up to the first supply voltage VSUP, and with the transistor M4 turned "off," the output signal B is logical high.

With the input signal ON at logical high, the transistor M9 is "off" and the transistor M10 is turned "on." If the first supply voltage VSUP were to drop below ground, the output signal B will stay in the same logical state when the first supply voltage returns above ground, because with the transistor M10 turned "on" a current will flow from the drain of the transistor M10 through the transistor R10 and along the signal path 104b' through the body diode 210 to the node that provides the output voltage B.

In another mode, the inverse of the input signal $\overline{\text{ON}}$ is logical high. With the inverse of the input signal ON logical high, the transistor M4 is turned "on" and draws current to ground so that the output signal B is logical low and the gate of transistor M7 is turned "on." With the transistor M7 turned "on" the drain of the transistor M7 is pulled up to the first supply voltage VSUP, and with the transistor M3 turned "off," the output signal A is logical high.

With the inverse of the input signal $\overline{\text{ON}}$ is logical high, the transistor M10 is "off" and the transistor M9 is turned "on." If the first supply voltage VSUP were to drop below ground, the output signal A will stay in the same logical state when the first supply voltage returns above ground, because with the transistor M9 turned "on" a current will flow from the drain of the transistor M9 through the transistor R9 and along the signal path 104a' through the body diode 212 to the node that provides the output voltage A.

Figure 3:
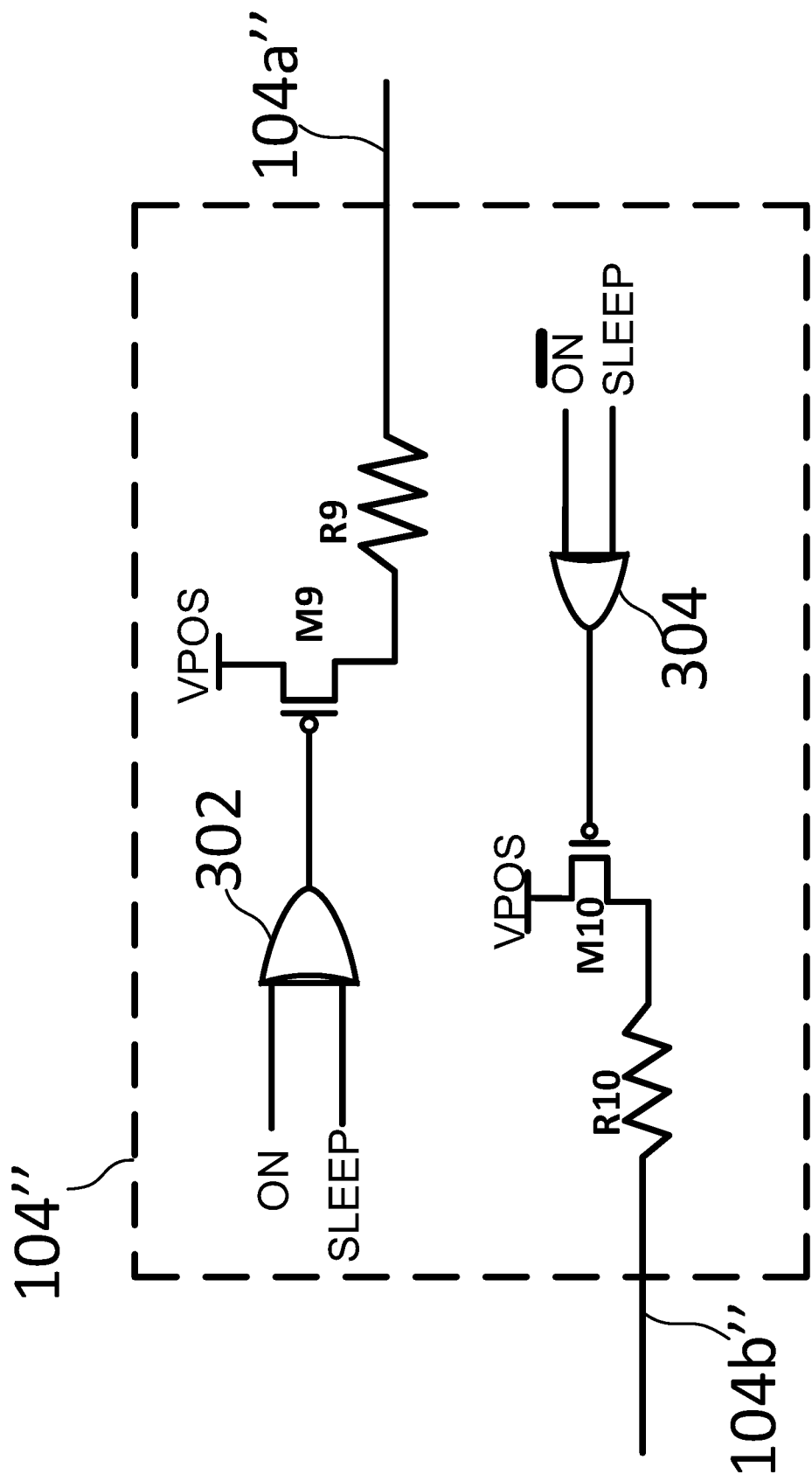
FIG. 3 is a circuit diagram of another example of the state reinforcement circuit.

Referring to FIG. 3, a reinforcement circuit 104" is another example of the reinforcement circuit 104' (FIG. 2). The reinforcement circuit 104" includes an OR gate 302. The "OR" gate 302 receives at a first input a signal SLEEP and at a second input the input signal ON. The output of the "OR" gate 302 is connected to the gate of the transistor M9.

In this configuration, if the SLEEP signal is logical low (e.g., "0"), the gate of the transistor M9 depends on the ON signal; and if the SLEEP signal is logical high (e.g., "1"), the gate of the transistor M9 is "off" regardless of the ON signal.

The reinforcement circuit 104" may also include an "OR" gate 304. The "OR" gate 304 receives at a first input a signal SLEEP and at a second input the inverse of the input signal $\overline{\text{ON}}$. The output of the OR gate 304 is connected to the gate of the transistor M10.

In this configuration, if the SLEEP signal is logical low (e.g., "0"), the gate of the transistor M10 depends on the inverse of the input signal $\overline{\text{ON}}$; and if the SLEEP signal is logical high (e.g., "1"), the gate of the transistor M9 is "off" regardless of the input of the inverse signal $\overline{\text{ON}}$.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An integrated circuit (IC) comprising:
    a level shifter configured to:
        generate a first output signal and a second output signal; and
        receive an input voltage, a first supply voltage and a second supply voltage; and
    a state reinforcement circuit configured to maintain a logical state of the second output signal in response to the first supply voltage having a voltage below ground and the input voltage is logical high, wherein the state reinforcement circuit comprises:
        a first transistor; and
        a second transistor, wherein if one of the first transistor or the second transistor is on, the other one of the first transistor or the second transistor is off,
    wherein if the input voltage is logical high, then the first output signal is logical low and the second output signal is logical high,
    wherein if the input voltage is logical low, the first output signal is logical high and the second output signal is logical low,
    wherein the level shifter comprises:
        a third transistor;
        a fourth transistor;
        a fifth transistor, wherein a source of the fifth transistor is connected to a drain of the third transistor and a first resistor, wherein a drain of the fifth transistor is connected to a first node that provides the first output signal; and
        a sixth transistor, wherein a source of the sixth transistor is connected to a drain of the fourth transistor and a second resistor, wherein a drain of the sixth transistor is connected to a second node that provides the second output signal.

2. The IC of claim 1, wherein the state reinforcement circuit is further configured to maintain a logical state of the first output signal in response to the first supply voltage having a voltage below ground and the input voltage is logical low.

3. An integrated circuit (IC) comprising:
    a level shifter configured to:
        generate a first output signal and a second output signal; and
        receive an input voltage, a first supply voltage and a second supply voltage; and
    a state reinforcement circuit configured to maintain a logical state of the second output signal in response to the first supply voltage having a voltage below ground and the input voltage is logical high,
    wherein if the input voltage is logical high, then the first output signal is logical low and the second output signal is logical high,
    wherein if the input voltage is logical low, the first output signal is logical high and the second output signal is logical low,
    wherein the state reinforcement circuit is further configured to maintain a logical state of the first output signal in response to the first supply voltage having a voltage below ground and the input voltage is logical low,
wherein the state reinforcement circuit comprises:
a first transistor connected to the second supply voltage;
a first resistor connected to the first transistor and to the level shifter;
a second transistor connected to the second supply voltage; and
a second resistor connected to the second transistor and to the level shifter,
wherein the first transistor and the first resistor enable the state reinforcement circuit to maintain a logical state of the first output signal in response to the first supply voltage having a voltage below ground and the input voltage is logical low,
wherein the second transistor and the second resistor enable the state reinforcement circuit to maintain a logical state of the second output signal in response to the first supply voltage having a voltage below ground and the input voltage is logical high.

4. The IC of claim 3, wherein a gate of the first transistor receives the input voltage.

5. The IC of claim 4, wherein a gate of the second transistor receives an inverse of the input voltage.

6. The IC of claim 5, wherein the first transistor is a p-channel metal-oxide-semiconductor field-effect transistor (PMOS) and the second transistor is a PMOS.

7. The IC of claim 3, wherein the level shifter comprises:
a third transistor;
a fourth transistor;
a fifth transistor, wherein a source of the fifth transistor is connected to a drain of the third transistor and the first resistor, wherein a drain of the fifth transistor is connected to a first node that provides the first output signal; and
a sixth transistor, wherein a source of the sixth transistor is connected to a drain of the fourth transistor and the second resistor, wherein a drain of the sixth transistor is connected to a second node that provides the second output signal.

8. The IC of claim 7, wherein a gate of the third transistor receives the input voltage, and
wherein a gate of the fourth transistor receives an inverse of the input voltage.

9. The IC of claim 8, wherein a gate of the fifth transistor and a gate of the sixth transistor are connected to the second supply voltage.

10. The IC of claim 9, wherein the third, fourth, fifth and sixth transistors are n-channel metal-oxide-semiconductor field-effect transistors (NMOS).

11. The IC of claim 3, wherein the state reinforcement further comprises a first OR gate,
wherein an output of the first OR gate is connected to a gate of the first transistor,
wherein a first input of the first OR gate receives the input voltage, and
wherein a second input of the first OR gate receives a sleep signal.

12. The IC of claim 11, wherein the state reinforcement further comprises a second OR gate,
wherein an output of the second OR gate is connected to a gate of the second transistor,
wherein a first input of the second OR gate receives an inverse of the input voltage, and
wherein a second input of the second OR gate receives the sleep signal.

13. The IC of claim 1, wherein a gate of the first transistor receives the input voltage,
wherein a gate of the second transistor receives an inverse of the input voltage.

14. The IC of claim 1, wherein the first transistor is a p-channel metal-oxide-semiconductor field-effect transistor (PMOS) and the second transistor is a PMOS.

15. The IC of claim 1, wherein a gate of the third transistor receives the input voltage, and
wherein a gate of the fourth transistor receives an inverse of the input voltage.

16. The IC of claim 15, wherein a gate of the fifth transistor and a gate of the sixth transistor are connected to the second supply voltage.

17. The IC of claim 16, wherein the third, fourth, fifth and sixth transistors are n-channel metal-oxide-semiconductor field-effect transistors (NMOS).

18. An integrated circuit (IC) comprising:
a level shifter configured to:
generate a first output signal and a second output signal; and
receive an input voltage, a first supply voltage and a second supply voltage; and
a state reinforcement circuit configured to maintain a logical state of the second output signal in response to the first supply voltage having a voltage below ground and the input voltage is logical high, wherein the state reinforcement circuit comprises:
a first transistor; and
a second transistor, wherein if one of the first transistor or the second transistor is on, the other one of the first transistor or the second transistor is off,
wherein if the input voltage is logical high, then the first output signal is logical low and the second output signal is logical high,
wherein if the input voltage is logical low, the first output signal is logical high and the second output signal is logical low,
wherein the state reinforcement further comprises a first OR gate,
wherein an output of the first OR gate is connected to a gate of the first transistor,
wherein a first input of the first OR gate receives the input voltage, and
wherein a second input of the first OR gate receives a sleep signal.

19. The IC of claim 18, wherein the state reinforcement further comprises a second OR gate,
wherein an output of the second OR gate is connected to a gate of the second transistor,
wherein a first input of the second OR gate receives an inverse of the input voltage, and
wherein a second input of the second OR gate receives the sleep signal.

20. The IC of claim 18, wherein the state reinforcement circuit is further configured to maintain a logical state of the first output signal in response to the first supply voltage having a voltage below ground and the input voltage is logical low.

21. The IC of claim 18, wherein the state reinforcement circuit comprises no more than two transistors.

22. The IC of claim 1, wherein the state reinforcement circuit comprises no more than two transistors.

23. The IC of claim 3, wherein the state reinforcement circuit comprises no more than two transistors.

* * * * *

UNITED STATES PATENT AND TRADEMARK OFFICE
CERTIFICATE OF CORRECTION

PATENT NO. : 10,979,051 B1
APPLICATION NO. : 16/907511
DATED : April 13, 2021
INVENTOR(S) : Thomas Ross et al.

It is certified that error appears in the above-identified patent and that said Letters Patent is hereby corrected as shown below:

In the Specification

Column 1, Line 8, delete "level a" and replace with --level to a--.

Column 1, Line 53, delete "of level" and replace with --of the level--.

Column 2, Line 1, delete "signals" and replace with --signal--.

Column 3, Line 7, delete "single" and replace with --signal--.

Column 3, Line 15, delete "single" and replace with --signal--.

Column 3, Line 17, delete "ON logical" and replace with --ON at logical--.

Column 3, Line 34, delete "ON logical" and replace with --ON at logical--.

Column 3, Line 52, delete "OR" and replace with --"OR"--.

Column 3, Line 63, delete "OR" and replace with --"OR"--.

Signed and Sealed this
Tenth Day of May, 2022

Katherine Kelly Vidal
*Director of the United States Patent and Trademark Office*